US010914767B2

(12) United States Patent
Neumann et al.

(10) Patent No.: US 10,914,767 B2
(45) Date of Patent: Feb. 9, 2021

(54) MEASURING ARRANGEMENT FOR IDENTIFYING A MALFUNCTION OF AN ENERGY ACCUMULATOR ASSEMBLY

(71) Applicant: Phoenix Contact GmbH & Co. KG, Blomberg (DE)

(72) Inventors: Daniel Neumann, Nieheim (DE); Eugen Mantler, Steinheim (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 418 days.

(21) Appl. No.: 15/737,707

(22) PCT Filed: Jun. 16, 2016

(86) PCT No.: PCT/EP2016/063861
§ 371 (c)(1),
(2) Date: Dec. 18, 2017

(87) PCT Pub. No.: WO2016/207052
PCT Pub. Date: Dec. 29, 2016

(65) Prior Publication Data
US 2018/0188296 A1    Jul. 5, 2018

(30) Foreign Application Priority Data

Jun. 24, 2015    (DE) .................. 10 2015 110 185

(51) Int. Cl.
*G01R 19/14*    (2006.01)
*G01R 31/392*    (2019.01)
(Continued)

(52) U.S. Cl.
CPC .......... *G01R 19/14* (2013.01); *G01R 31/392* (2019.01); *G01R 31/396* (2019.01); *H02H 1/0007* (2013.01); *H02H 3/02* (2013.01)

(58) Field of Classification Search
CPC .... G01R 19/14; G01R 31/392; G01R 31/396; H02H 1/0007; H02H 3/02
(Continued)

(56) References Cited

U.S. PATENT DOCUMENTS

2012/0182021 A1* 7/2012 McCoy ............. G01R 31/3832
324/433

FOREIGN PATENT DOCUMENTS

CN    101697462 A    4/2010
CN    102175975 A    9/2011
(Continued)

*Primary Examiner* — Dharti H Patel
(74) *Attorney, Agent, or Firm* — Holland & Hart LLP

(57) ABSTRACT

The present disclosure relates to a measuring arrangement for identifying a malfunction of an energy accumulator arrangement having a first energy accumulator and at least one further energy accumulator, the first energy accumulator and the further energy accumulator being electrically connected in parallel, comprising: a measuring device configured to capture a polarity of an electrical measurement variable of the first energy accumulator and a polarity of a further electrical measurement variable in the energy accumulator arrangement; and a processor device configured to identify the malfunction of the energy accumulator arrangement by comparing the polarity of the electrical measurement variable of the first energy accumulator and the polarity of the further electrical measurement variable.

20 Claims, 5 Drawing Sheets

(51) Int. Cl.
*G01R 31/396* (2019.01)
*H02H 1/00* (2006.01)
*H02H 3/02* (2006.01)

(58) Field of Classification Search
USPC .......................................................... 361/78
See application file for complete search history.

(56) References Cited

FOREIGN PATENT DOCUMENTS

| | | |
|---|---|---|
| CN | 102207529 A | 10/2011 |
| CN | 102906584 A | 1/2013 |
| CN | 102928789 A | 2/2013 |
| CN | 104518230 A | 4/2015 |
| CN | 104577240 A | 4/2015 |
| DE | 602 02 485 T2 | 12/2005 |
| DE | 20 2012 006 202 U1 | 9/2012 |
| DE | 10 2012 215 061 A1 | 2/2014 |
| EP | 0 982 830 A2 | 3/2000 |
| EP | 1 203964 A2 | 5/2002 |
| JP | 2006010450 A | 1/2012 |
| WO | WO 2013/182440 A2 | 12/2013 |

\* cited by examiner

MEASURING ARRANGEMENT FOR IDENTIFYING A MALFUNCTION OF AN ENERGY ACCUMULATOR ASSEMBLY

CROSS-REFERENCE TO RELATED APPLICATIONS

This application is a 371 national phase filing of International Application No. PCT/EP2016/063861, entitled "MEASURING ARRANGEMENT FOR IDENTIFYING A MALFUNCTION OF AN ENERGY ACCUMULATOR ASSEMBLY", filed 16 Jun. 2016, which claims priority to German Patent Application No. 10 2015 110 185.8, entitled "MESSANORDNUNG ZUM ERKENNEN EINER FEHLFUNKTION EINER ENERGIESPEICHERANORDNUNG", filed 24 Jun. 2015.

BACKGROUND

The present disclosure relates to a measuring arrangement for monitoring energy accumulators in an energy accumulator arrangement and for identifying defective energy accumulators in the energy accumulator arrangement.

Energy accumulator arrangements which consist of a plurality of electrically connected energy accumulators are used in uninterruptible power supplies (UPS), for example. The task of a UPS is to protect electrical installations which are connected to a power supply system from disruptions in the power supply system. If the mains current fails or fluctuates, the energy accumulators of the UPS may assume the power supply for the electrical installation within a few milliseconds. The energy accumulators of the UPS are often rechargeable batteries, for example lithium polymer accumulators. These energy accumulators are usually connected in parallel in order to form a common energy accumulator with a high charging capacity.

During the service life of a UPS, the energy accumulators are exposed to an ageing process, for example on account of the loading caused by regular charging and discharging operations or on account of temperature fluctuations. This may result in premature defects of individual energy accumulators in the energy accumulator arrangement. Defects in individual energy accumulators may reduce the reliability of the UPS system and, in the extreme case, may result in complete failure of the UPS system. The usually parallel connection makes it difficult to evaluate the individual energy accumulators, with the result that an individual defective energy accumulator in the energy accumulator arrangement is difficult to identify.

SUMMARY

The object on which the present disclosure is based is to provide a measuring arrangement for monitoring energy accumulators in an energy accumulator arrangement and for identifying defective energy accumulators in the energy accumulator arrangement.

This object is achieved by means of subjects having the features according to the independent claims. The figures, the description and the dependent claims relate to advantageous examples of the disclosure.

According to a first aspect of the disclosure, the object is achieved by means of a measuring arrangement for identifying a malfunction of an energy accumulator arrangement having a first energy accumulator and having at least one further energy accumulator, the first energy accumulator and the further energy accumulator being electrically connected in parallel, comprising: a measuring device which is configured to capture a polarity of an electrical measurement variable of the first energy accumulator and a polarity of a further electrical measurement variable in the energy accumulator arrangement; and a processor device which is configured to identify the malfunction of the energy accumulator arrangement by comparing the polarity of the electrical measurement variable of the first energy accumulator and the polarity of the further electrical measurement variable. This achieves the advantage that a malfunction of an energy accumulator in the energy accumulator arrangement can be detected during ongoing operation and without restricting the use of the energy accumulator arrangement.

The measuring arrangement may be in the form of a closed module which comprises a housing, for example, in which all components of the measuring arrangement are arranged. This module may provide electrical terminals for an external energy accumulator arrangement. Furthermore, the measuring arrangement, together with the energy accumulator arrangement, can form a closed component part in which, for example, the components of the measuring arrangement and the energy accumulators are arranged in a common housing.

The energy accumulators may be rechargeable batteries, for example lithium ion accumulators, lithium polymer accumulators or lead accumulators, which may have an accumulator voltage of 12 or 24 V, for example. In this case, the energy accumulators which are electrically connected to one another in the energy accumulator arrangement may be of the same type and may have an identical voltage and an identical acid density.

The processor device may be a microcontroller, the microcontroller being able to comprise a processor and/or a memory. The processor device may be electrically connected to the measuring device for the purpose of receiving the measured electrical measurement variables. The processor device may also be configured in such a manner that it calculates parameter values from the received electrical measurement variables.

In one advantageous example, of the measuring arrangement, the processor device is configured to identify the malfunction of the energy accumulator arrangement if the polarity of the electrical measurement variable of the first energy accumulator and the polarity of the further electrical measurement variable are different. This achieves the advantage that it is possible to efficiently identify a defective energy accumulator.

In another advantageous example, of the measuring arrangement, the measuring device is configured to capture the polarity of the electrical measurement variable of the first energy accumulator and the polarity of the further electrical measurement variable by capturing an electrical direction of the electrical measurement variable of the first energy accumulator and of the further electrical measurement variable. This achieves the advantage that it is possible to efficiently capture the polarities of the measured electrical measurement variables.

In another advantageous example, of the measuring arrangement, the further electrical measurement variable is an electrical measurement variable of the further energy accumulator, or the further electrical measurement variable is an electrical measurement variable at a connection point of the first energy accumulator and of the further energy accumulator. This achieves the advantage that the polarity of the electrical measurement variables of individual energy accumulators in the energy accumulator arrangement and the polarity of common electrical measurement variables of a plurality of energy accumulators in the energy accumulator arrangement can be used to identify a defective energy accumulator.

In another advantageous example, of the measuring arrangement, the measuring arrangement has a first measuring unit for capturing the polarity of the electrical measurement variable of the first energy accumulator, and a further measuring unit for capturing the polarity of the further electrical measurement variable. This achieves the advantage that the polarity of the electrical measurement variable of each energy accumulator in the energy accumulator arrangement can be efficiently captured.

In another advantageous example, of the measuring arrangement, the first measuring unit is configured to capture the polarity of the electrical measurement variable of the first energy accumulator, and the further measuring unit is configured to capture the polarity of the electrical measurement variable of the further energy accumulator, or the further measuring unit is configured to capture the polarity of the further electrical measurement variable at a connection point of the first energy accumulator and of the further energy accumulator. This achieves the advantage that the polarity of the electrical measurement variables of individual energy accumulators in the energy accumulator arrangement and the polarity of common electrical measurement variables of a plurality of energy accumulators in the energy accumulator arrangement can be efficiently captured.

In another advantageous example, of the measuring arrangement, the further measuring unit is configured to capture the polarity of the electrical measurement variable of the further energy accumulator, the measuring device having a common measuring unit for capturing the polarity of the electrical measurement variable at the connection point of the first energy accumulator and of the further energy accumulator in order to obtain a common polarity, and the processor device being configured to identify the malfunction of the energy accumulator arrangement by comparing the polarity of the electrical measurement variable of the first energy accumulator or the polarity of the further electrical measurement variable with the common polarity. This achieves the advantage that it is possible to efficiently identify the defective energy accumulators in the energy accumulator arrangement.

In another advantageous example, of the measuring arrangement, the measuring arrangement has a circuit arrangement having a first controllable switch for electrically connecting the first energy accumulator to the measuring device and having a further controllable switch for electrically connecting the further energy accumulator to the measuring device in order to connect the first energy accumulator and the further energy accumulator in parallel, the processor device being configured to close the first switch and the further switch or to keep them closed for the purpose of capturing the polarity of the electrical measurement variable of the first energy accumulator and for the purpose of capturing the polarity of the further electrical measurement variable. This achieves the advantage that the energy accumulators are available to the measuring device while capturing the polarities.

The controllable switches of the circuit arrangement may be transistor switches, in particular MOSFET switches. In particular, each controllable switch may consist of an electrical circuit comprising two MOSFET switches which are connected in series and the source terminals of which are electrically connected. In addition, a Zener diode can be connected between the source and gate terminals of the MOSFET switches for the purpose of limiting the voltage.

In another advantageous example, of the measuring arrangement, the processor device is configured to keep the first switch closed and to open the further switch in order to disconnect the further electrical energy accumulator from the measuring device for the purpose of capturing the first electrical measurement variable of the first energy accumulator and to keep the further switch closed and to open the first switch in order to disconnect the first energy accumulator from the measuring device for the purpose of capturing the further electrical measurement variable of the further electrical energy accumulator, and the measuring device being configured to measure the first electrical measurement variable and the further electrical measurement variable in succession. This achieves the advantage that the measuring arrangement can be used to capture the electrical measurement variable of each energy accumulator in the energy accumulator arrangement efficiently and in a manner which is not influenced by the other energy accumulators in the energy accumulator arrangement.

If the controllable switches are transistor switches, the processor device may be electrically connected to the gate electrodes of the transistor switches for the purpose of controlling the controllable switches and may electrically control them by applying a gate voltage. In order to provide a sufficiently high gate voltage when controlling the gate electrodes of the transistor switches, DC-DC converters, for example boost converters or charge pumps, may be connected between the processor device and the gate electrodes of the transistor switches.

In another advantageous example, of the measuring arrangement, the processor device is configured to capture the first electrical measurement variable and the further electrical measurement variable if a malfunction of an energy accumulator in the energy accumulator arrangement is identified. This achieves the advantage that the individual energy accumulators can be specifically checked in order to uniquely identify a defective energy accumulator.

In another advantageous example, of the measuring arrangement, the measuring device is configured to capture the electrical measurement variable of the first energy accumulator and the electrical measurement variable of the further energy accumulator in temporally successive measurement intervals, precisely only one switch of the circuit arrangement being closed and all other switches of the circuit arrangement being open within a measurement interval. This achieves the advantage that an electrical measurement variable of an energy accumulator can be measured efficiently and in a manner which is not influenced by the other energy accumulators in the energy accumulator arrangement.

In another advantageous example, of the measuring arrangement, the processor device is configured to keep only the first switch closed and to open the further switch within a first measurement interval and to keep only the further switch closed and to open the first switch within a further measurement interval. This achieves the advantage that the electrical measurement variable of each energy accumulator in the energy accumulator arrangement can be captured in a manner which is not influenced by further energy accumulators in the energy accumulator arrangement.

In another advantageous example, of the measuring arrangement, the processor device is configured to evaluate the measured electrical measurement variables, in particular to compare them with electrical reference variables, in order to detect a malfunction of the first energy accumulator or of the further energy accumulator. This achieves the advantage that individual defective energy accumulators in the energy accumulator arrangement can be efficiently identified.

In another advantageous example, of the measuring arrangement, the processor device is configured to permanently open the first controllable switch if a malfunction of the first energy accumulator is detected in order to disconnect the first energy accumulator or to permanently open the further controllable switch if a malfunction of the further energy accumulator is detected in order to disconnect the further energy accumulator. This achieves the advantage that a negative influence of the energy accumulator arrangement as a result of a defective energy accumulator can be prevented.

In another advantageous example, of the measuring arrangement, the measuring arrangement has a connection terminal for connecting the circuit arrangement to an auxiliary energy supply apparatus, in particular an uninterruptible voltage supply, in order to provide the electrical energy accumulators for the auxiliary energy supply. This achieves the advantage that it is possible to provide an auxiliary energy supply apparatus having a high degree of reliability.

In another advantageous example, of the measuring arrangement, the auxiliary energy supply apparatus comprises a charging function and/or an external charger for electrically charging the energy accumulators.

In another advantageous example, of the measuring arrangement, the measuring arrangement comprises the first energy accumulator and the further energy accumulator. This achieves the advantage that it is possible to provide an extended energy accumulator arrangement which can monitor the energy accumulators integrated in it and can identify defective energy accumulators.

In another advantageous example, of the measuring arrangement, the measuring arrangement has a communication interface, in particular a LIN bus interface, for outputting electrical measurement variables and/or parameters or for receiving parameters and/or control commands. This achieves the advantage that efficient communication can take place between the measuring arrangement and an apparatus connected to the measuring arrangement. The apparatus may be an auxiliary energy supply apparatus, for example.

The communication interface may be connected to a communication line in the measuring device. Furthermore, the processor device and/or the measuring units of the measuring device and/or the energy accumulators in the energy accumulator arrangement may be connected to the communication line. In this manner, the measurement variables captured by the processor device can be transmitted to the apparatus connected to the communication interface via the communication line or control commands, for example commands for opening or closing the controllable switches, can be transmitted from the apparatus connected to the communication interface to the processor device. In addition, operating parameters of the energy accumulators can be transmitted to the processor device or to the apparatus connected to the communication interface via the communication line.

According to a second aspect of the disclosure, the object is achieved by means of an auxiliary energy supply apparatus for providing electrical energy in a manner independent of the mains, the measuring arrangement according to the disclosure being integrated in the auxiliary energy supply apparatus. This achieves the advantage that it is possible to provide an auxiliary energy supply apparatus having a high degree of reliability which can be used without externally connected energy accumulators.

BRIEF DESCRIPTION OF THE DRAWINGS

Examples of the disclosure are illustrated in the drawings and are described in more detail below.

In the drawings.

DETAILED DESCRIPTION

Figure 1:
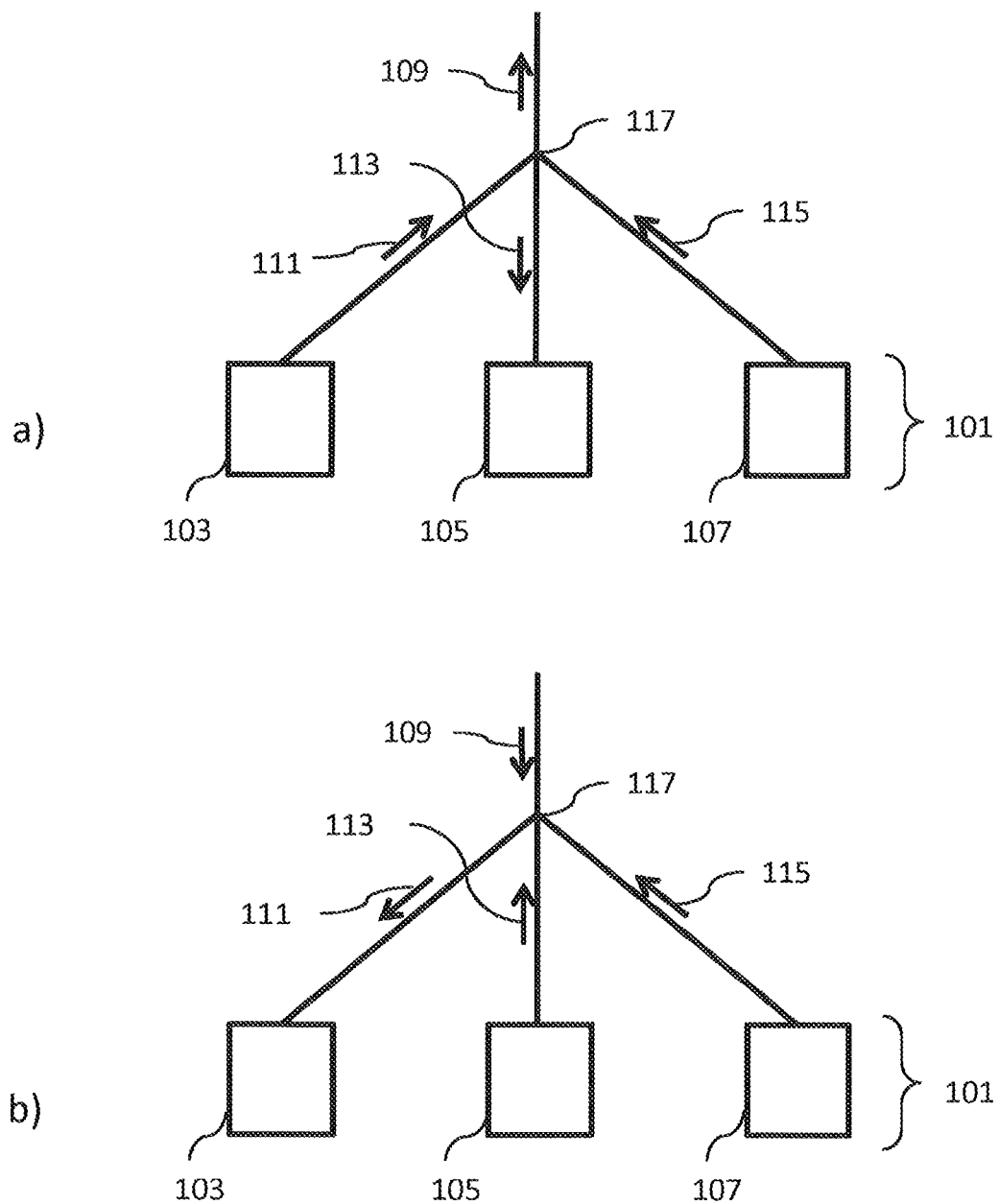
FIG. 1a shows a schematic illustration of the polarities of the electrical measurement variables of a plurality of energy accumulators.
FIG. 1b shows a schematic illustration of the polarities of the electrical measurement variables of a plurality of energy accumulators.

FIG. 1a and FIG. 1b show schematic illustrations of the polarities of electrical measurement variables in an energy accumulator arrangement 101 consisting of a first energy accumulator 103 and two further energy accumulators 105, 107 which are electrically connected at a connection point 117.

The energy accumulators may be rechargeable batteries, for example lithium ion accumulators, lithium polymer accumulators or lead accumulators, which may have a rechargeable battery voltage of 12 or 24 V, for example. In this case, the energy accumulators which are electrically connected to one another in the energy accumulator arrangement 101 may be of the same type and may have an identical voltage and an identical acid density.

The electrical measurement variable in FIG. 1a and FIG. 1b relates to the charging or discharging current of the first energy accumulator 103, the charging or discharging currents of the further energy accumulators 105, 107 and the common charging or discharging current of the energy accumulator arrangement 101. The arrows in FIG. 1a and FIG. 1b mark the current direction 111 of the charging or discharging current of the first energy accumulator 103, the current directions 113, 115 of the charging or discharging currents of the further energy accumulators 105, 107 and the common current direction 109 of the charging or discharging currents of the energy accumulator arrangement 101.

In FIG. 1a, the common current direction 109 of the energy accumulator arrangement 101, the current direction 111 of the first energy accumulator 103 and the current direction 115 of a further energy accumulator 107 point in the discharging direction. However, the current direction 113 of an additional, further energy accumulator 105 points in the charging direction. This deviation can indicate a defect of the further energy accumulator 105. The defective further energy accumulator 105 in FIG. 1a is not discharged and instead obtains a charging current which is obtained from the first energy accumulator 103 and/or the other further energy accumulator 107. In this arrangement, the defective further energy accumulator 105 can be identified by measuring the polarities of the charging or discharging current of the first energy accumulator 103, the polarities of the charging or discharging currents of the further energy accumulators 105, 107 and the polarity of the common charging or discharging current of the energy accumulator arrangement 101.

In FIG. 1b, the common current direction 109 of the energy accumulator arrangement 101 and the current direction 111 of the first energy accumulator 103 point in the charging direction. However, the current directions 113, 115 of the further energy accumulators 105, 107 point in the discharging direction. This deviation may indicate a defect of the first energy accumulator 103. The further energy accumulators 105, 107 in FIG. 1b are discharged and provide the first energy accumulator 103 with an additional charging current. This may be caused by a malfunction of the first energy accumulator 103 which, on account of a defect, obtains an additional charging current from the further energy accumulators 105, 107. In this arrangement, the defective first energy accumulator 103 can be identified by measuring the polarities of the charging or discharging current of the first energy accumulator 103, the polarities of the charging or discharging currents of the further energy accumulators 105, 107 and the polarity of the common charging or discharging current of the energy accumulators.

Figure 2:
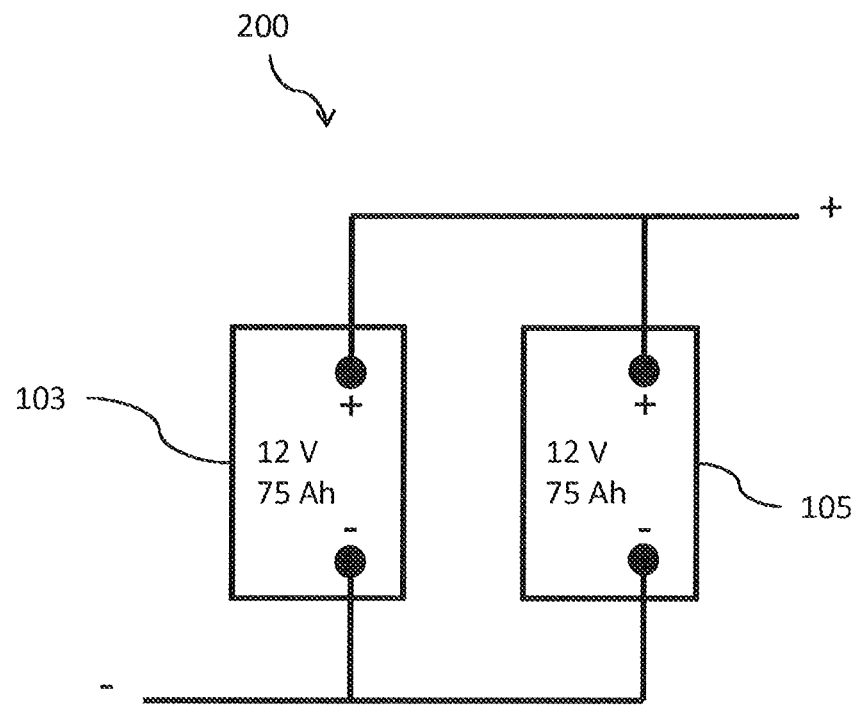
FIG. 2 shows a schematic illustration of a parallel circuit comprising two energy accumulators.

FIG. 2 shows a schematic illustration of a parallel circuit 200 comprising a first energy accumulator 103 and a further energy accumulator 105.

The parallel circuit 200 comprising the first energy accumulator 103 and the further energy accumulator 105 can be formed by electrically connecting the positive poles of the energy accumulators and the negative poles of the energy accumulators to one another. According to another example, the energy accumulators connected in this manner may be energy accumulators of the same type, for example accumulators with the same voltage and the same acid density.

In FIG. 2, the first energy accumulator 103 and the further energy accumulator 105, for example, each have a voltage of 12 V and a charging capacity of 75 Ah. As a result of the parallel circuit 200, the charging capacity of the first energy accumulator 103 and the charging capacity of the further energy accumulator 105 are added, while the voltage of the parallel circuit 200 corresponds to the voltage of the individual energy accumulators. The resulting parallel circuit 200 comprising the energy accumulators in FIG. 2 has a voltage of 12 V and a charging capacity of 150 Ah. This makes it possible to provide a parallel circuit 200 comprising any desired number of individual energy accumulators each with the same voltage, the resulting voltage of the parallel circuit 200 corresponding to the voltages of the individual energy accumulators and the charging capacity of the parallel circuit 200 corresponding to the sum of the charging capacities of the individual energy accumulators. According to another example, the first energy accumulator 103 and the further energy accumulator 105 may be lithium ion accumulators, lithium polymer accumulators or lead accumulators.

Figure 3:
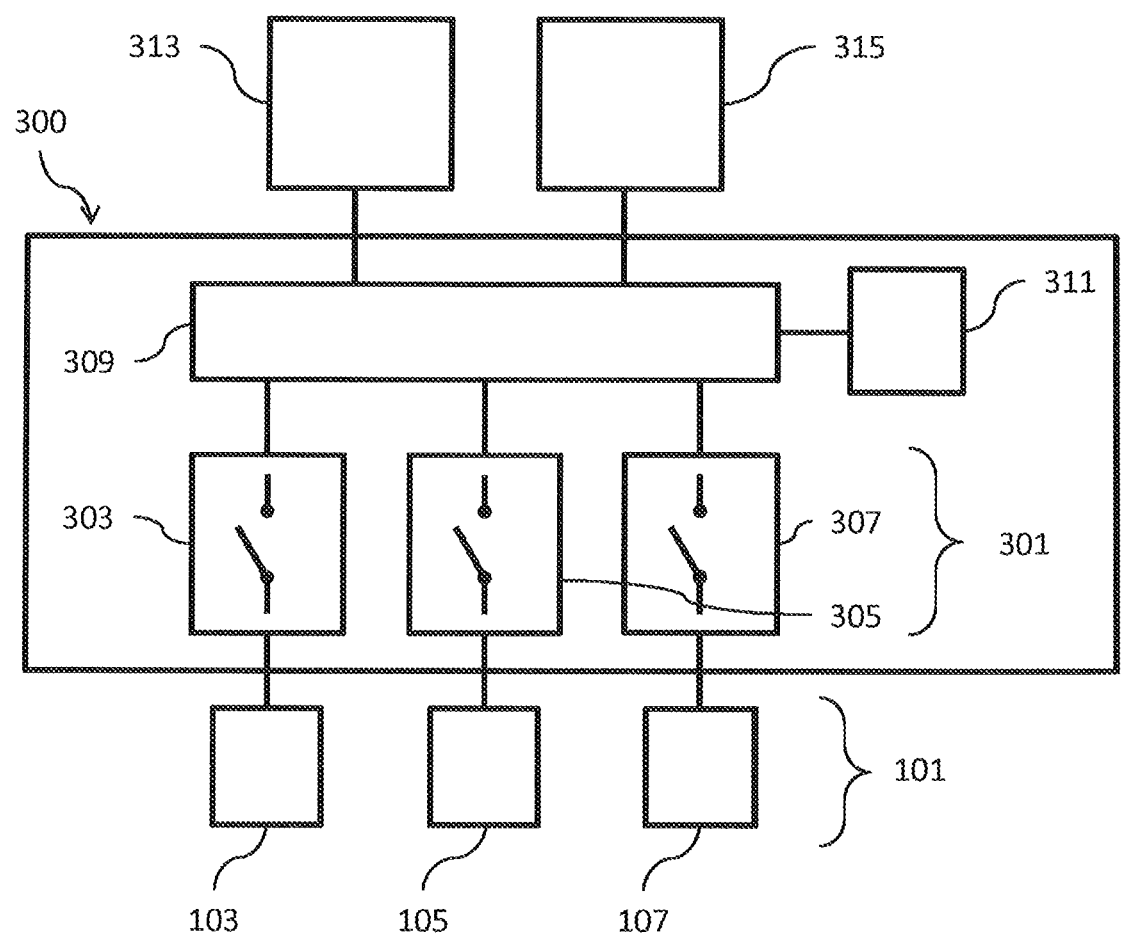
FIG. 3 shows a schematic illustration of a measuring arrangement.

FIG. 3 shows a schematic illustration of a measuring arrangement 300. The measuring arrangement 300 has a measuring device 309, a circuit arrangement 301 and a processor device 311, an energy accumulator arrangement 101, an auxiliary energy supply apparatus 313 and an external charger 315 being connected to the measuring arrangement 300. The circuit arrangement 301 comprises a first controllable switch 303 and two further controllable switches 305, 307, to which a first energy accumulator 103 and two further energy accumulators 105, 107 are connected.

The measuring arrangement 300 for identifying a malfunction of the energy accumulator arrangement 101 having the first energy accumulator 103 and having at least one further energy accumulator 105, 107, the first energy accumulator 103 and the further energy accumulator 105, 107 being electrically connected in parallel, comprises the measuring device 309 which is configured to capture a polarity of the electrical measurement variable of the first energy accumulator 103 and the polarity of the further electrical measurement variable in the energy accumulator arrangement 101; and the processor device 311 which is configured to identify the malfunction of the energy accumulator arrangement 101 by comparing the polarity of the electrical measurement variable of the first energy accumulator 103 and the polarity of the further electrical measurement variable.

The measuring arrangement 300 may be in the form of a closed module which comprises a housing, for example, in which all components of the measuring arrangement 300 are arranged. This module may provide electrical terminals for an external energy accumulator arrangement 101. Furthermore, the measuring arrangement 300, together with the energy accumulator arrangement 101, can form a closed component part in which, for example, the components of the measuring arrangement 300 and the energy accumulator arrangement 101 are arranged in a common housing.

The processor device 311 may be a microcontroller, the microcontroller being able to comprise a processor and/or a memory. The processor device 311 may be electrically connected to the measuring device 309 for the purpose of receiving the measured electrical measurement variables. The processor device 311 may also be configured in such a manner that it calculates parameter values from the received electrical measurement variables.

According to another example, the controllable switches of the circuit arrangement 301 are transistor switches, in particular MOSFET switches. In particular, each controllable switch may consist of an electrical circuit comprising two MOSFET switches which are connected in series and the source terminals of which are electrically connected. In addition, a Zener diode can be connected between the source and gate terminals of the MOSFET switches for the purpose of limiting the voltage.

According to another example, the processor device 311 may be electrically connected to the gate electrodes of the transistor switches for the purpose of controlling the controllable switches and may electrically control them by applying a gate voltage. In order to provide a sufficiently high gate voltage when controlling the gate electrodes of the transistor switches, DC-DC converters, for example boost converters or charge pumps, may be connected between the processor device 311 and the gate electrodes of the transistor switches.

Figure 4:
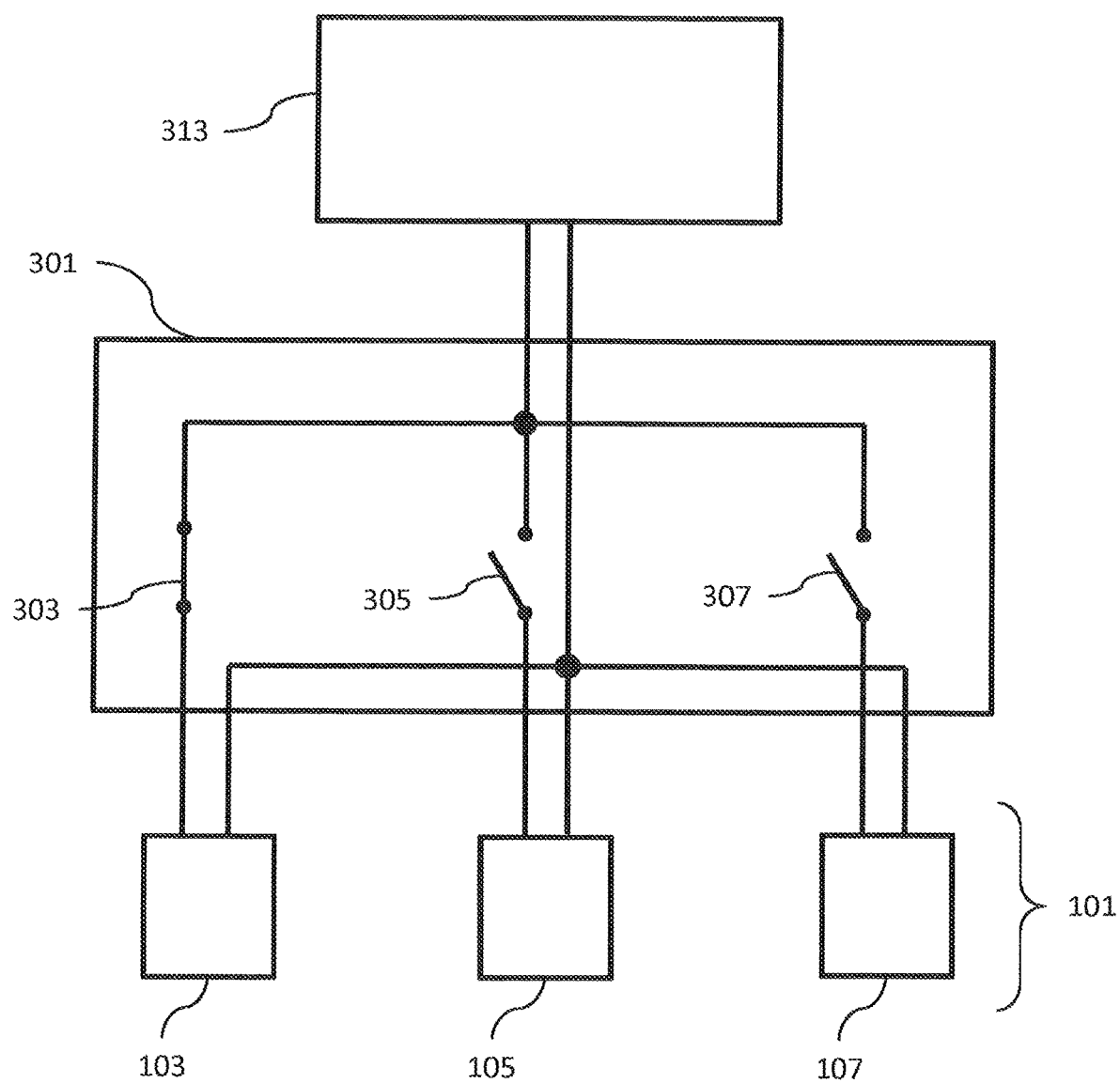
FIG. 4 shows a schematic illustration of a circuit arrangement.

FIG. 4 shows a schematic illustration of a circuit arrangement 301 consisting of a first controllable switch 303 and two further controllable switches 305, 307, to which an energy accumulator arrangement 101 consisting of a first energy accumulator 103 and two further energy accumulators 105, 107 is connected. An auxiliary energy supply apparatus 313 is also connected to the circuit arrangement 301.

The first controllable switch 303 or the further controllable switches 305, 307 of the circuit arrangement 301 may be opened in order to interrupt the connection of the first energy accumulator 103 or of the further energy accumulators 105, 107 to the auxiliary energy supply apparatus 313 and/or to the measuring device 309. In FIG. 4, the first controllable switch 303 is closed and the further controllable switches 305, 307 are open. The measuring device 309 and the processor device 311 are not depicted in FIG. 4.

According to another example, a possibility of disconnecting defective energy accumulators in the energy accumulator arrangement 101 may be provided by means of the controllable switches. If a defective energy accumulator is determined, the controllable switch connected to the defective energy accumulator can be permanently opened and the connection of the defective energy accumulator to the auxiliary energy supply apparatus 313 and/or to the measuring arrangement 309 and/or to the remaining energy accumulators in the energy accumulator arrangement 101 can therefore be permanently interrupted. Disconnecting a defective energy accumulator makes it possible to avoid a negative influence of the remaining energy accumulators, for example a discharge of the remaining energy accumulators as a result of the defective energy accumulator.

According to another example, the individual energy accumulators 103, 105, 107 in the energy accumulator arrangement 101 can be cyclically checked. This cyclical check can be carried out in temporally successive measurement intervals, a controllable switch which is connected to an energy accumulator to be checked being closed and all other controllable switches of the circuit arrangement 301 being opened in each measurement interval. The electrical measurement variable of the energy accumulator to be checked can therefore be effected in a manner which is not influenced by the remaining energy accumulators in the energy accumulator arrangement 101 in the measurement interval. FIG. 4 shows, for example, the position of the switches in a measurement interval in which the first energy accumulator 103 is checked and only the first controllable switch 303 is closed and the further controllable switches 305, 307 are open for this purpose. According to another example, the energy accumulators can be cyclically checked in this manner in temporally successive measurement intervals in a test mode of the measuring arrangement 300 which differs from the operating mode in which all controllable switches are closed.

Figure 5:
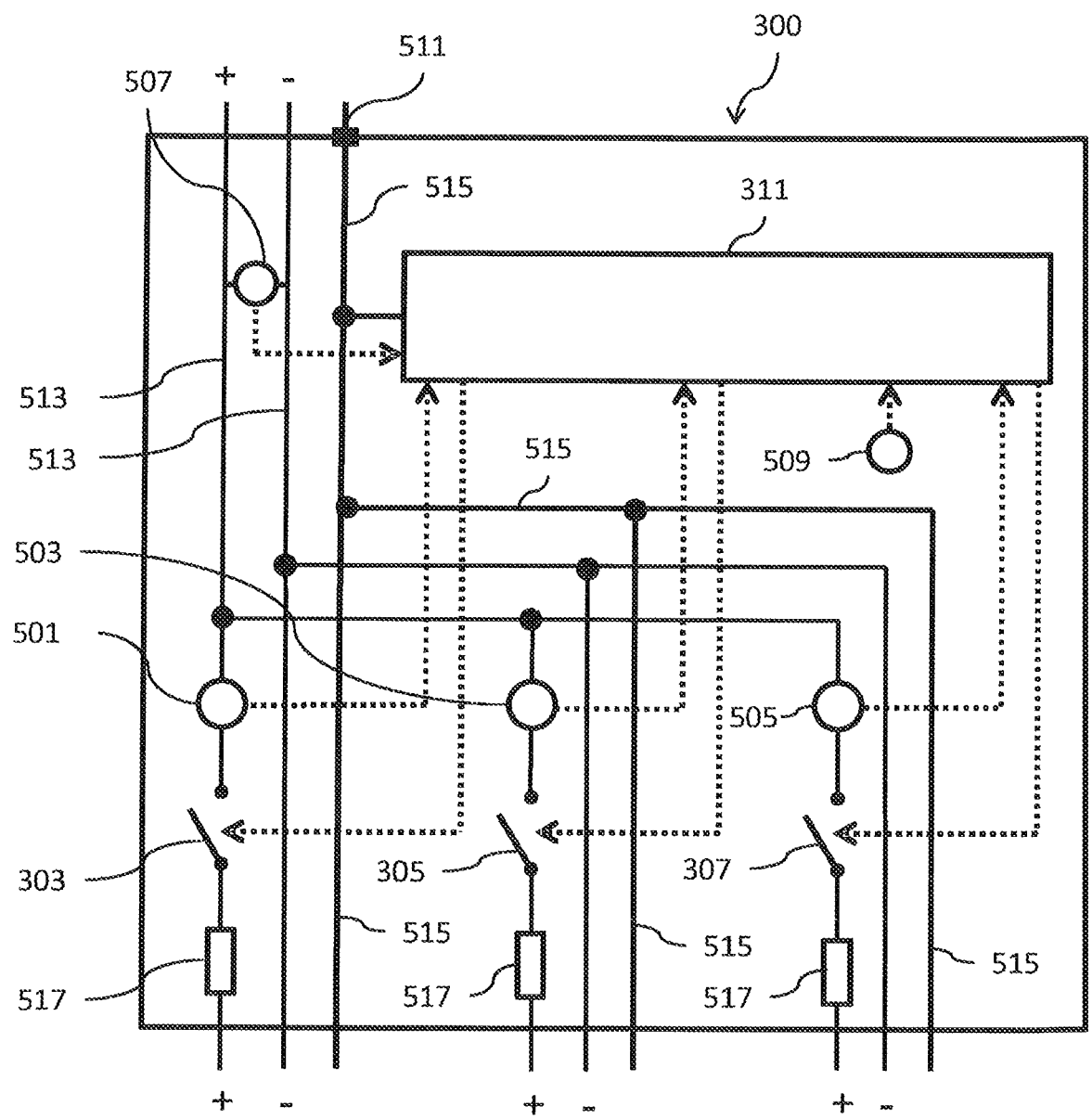
FIG. 5 shows a schematic illustration of a measuring arrangement.

FIG. 5 shows a schematic illustration of a measuring arrangement 300, individual measuring units of the measuring device 309 being illustrated. The measuring units are a first measuring unit 501 which is connected to the first controllable switch 303, two further measuring units 503, 505 which are each connected to a further controllable switch 305, 307, and a common measuring unit 507 and an environment measuring unit 509. The measuring arrangement 300 also has an electrical line arrangement 513 which connects the energy accumulators in parallel in the measuring arrangement 300, and a communication line 515 which is connected to the energy accumulators, the processor device 311 and a communication interface 511.

The first measuring unit 501 and the further measuring units 503, 505 may capture an electrical measurement variable of the first energy accumulator 103 or an electrical measurement variable of the further energy accumulators 105, 107. These electrical measurement variables may be an internal resistance, a voltage or a current. According to one example, the electrical measurement variables may be charging or discharging currents of the first energy accumulator 103 and of the further energy accumulators 105, 107, the current direction indicating the polarity of the electrical measurement variables. The common measuring unit 507 can capture a common electrical measurement variable of the first and further energy accumulators. The common electrical measurement variable may likewise be an internal resistance, a voltage or a current. The common electrical measurement variable may also be a common charging or discharging current of the first energy accumulator 103 and of the further energy accumulators 105, 107, the current direction indicating the common polarity of the common electrical measurement variable.

According to another example, the first measuring unit 501, the further measuring units 503, 505 and the common measuring unit 507 are electrically connected to the processor device 311. The electrical measurement variables determined in the measuring units can therefore be transmitted to the processor device 311 and can be evaluated in the processor device 311. This evaluation may consist of a comparison of the electrical measurement variables with one another or a comparison of the electrical measurement variables with electrical reference variables. According to another example, the environment measuring unit 509 is a temperature measuring unit which is likewise electrically connected to the processor device 311. The measured temperature values can be evaluated in the processor device 311. For example, a defective energy accumulator can be inferred from a severe rise in the temperature.

According to another example, a communication line 515 is connected to the communication interface 511. This communication line 515 connects the communication interface 511 to the processor device 311 and/or to the energy accumulators in the energy accumulator arrangement 101. If an apparatus, for example an auxiliary energy supply apparatus 313, is also connected to the communication interface 511, parameter values and measurement variables can be transmitted from the processor device 311 or the energy accumulators 103, 105, 107 to the connected apparatus, or commands, for example control commands for opening or closing the controllable switches, can be transmitted from the connected apparatus to the processor device 311.

According to another example, the communication interface 511 is a LIN bus interface and communication takes place via the communication line 515 according to a LIN bus standard. In this LIN bus system, the auxiliary energy supply apparatus 313 may be set up as a master and the processor device 311 and the energy accumulators may be set up as slaves. In order to communicate via the LIN bus, a unique communication address can be assigned to each component connected to the communication line 515.

According to another example, the controllable switches 303, 305, 307 of the circuit arrangement 301 are electrically connected to the energy accumulators 103, 105, 107 in the energy accumulator arrangement 101 via electrical resistors 517. These electrical resistors 517 can be used when measuring the internal resistance or the charging or discharging currents of the energy accumulators 103, 105, 107.

All features explained and shown in connection with individual examples of the disclosure may be provided in a different combination in the subject matter according to the disclosure in order to simultaneously achieve their advantageous effects.

LIST OF REFERENCE NUMBERS

101 Energy accumulator arrangement
103 First energy accumulator
105 Further energy accumulator
107 Further energy accumulator
109 Common current direction of the energy accumulator arrangement
111 Current direction of the first energy accumulator
113 Current direction of a further energy accumulator
115 Current direction of a further energy accumulator
117 Connection point
200 Parallel circuit
300 Measuring arrangement 301 Circuit arrangement
303 First controllable switch
305 Further controllable switch
307 Further controllable switch
309 Measuring device
311 Processor device
313 Auxiliary energy supply apparatus
315 External charger
501 First measuring unit
503 Further measuring unit
505 Further measuring unit
507 Common measuring unit
509 Environment measuring unit
511 Communication interface
513 Electrical line arrangement
515 Communication line
517 Electrical resistor

What is claimed is:

1. A measuring arrangement for identifying a malfunction of an energy accumulator arrangement comprising a first energy accumulator and at least one further energy accumulator, the first energy accumulator and the further energy accumulator being electrically connected in parallel, comprising:
a measuring device configured to capture a polarity of an electrical measurement variable of the first energy accumulator and a polarity of a further electrical measurement variable in the energy accumulator arrangement;
a processor device configured to identify the malfunction of the energy accumulator arrangement by comparing the polarity of the electrical measurement variable of the first energy accumulator and the polarity of the further electrical measurement variable; and
a communication interface.

2. The measuring arrangement of claim 1, the processor device being configured to identify the malfunction of the energy accumulator arrangement if the polarity of the electrical measurement variable of the first energy accumulator and the polarity of the further electrical measurement variable are different.

3. The measuring arrangement of claim 1, the measuring device being configured to capture the polarity of the electrical measurement variable of the first energy accumulator and the polarity of the further electrical measurement variable by capturing an electrical direction of the electrical measurement variable of the first energy accumulator and of the further electrical measurement variable.

4. The measuring arrangement of claim 1, wherein the further electrical measurement variable comprises at least one of: an electrical measurement variable of the further energy accumulator, or an electrical measurement variable at a connection point of the first energy accumulator and of the further energy accumulator.

5. The measuring arrangement of claim 1, further comprising:
a first measuring unit configured to capture the polarity of the electrical measurement variable of the first energy accumulator; and
a further measuring unit configured to capture the polarity of the further electrical measurement variable.

6. The measuring arrangement of claim 5, wherein:
the first measuring unit is configured to capture the polarity of the electrical measurement variable of the first energy accumulator;
the further measuring unit is configured to capture the polarity of the electrical measurement variable of the further energy accumulator or the polarity of the further electrical measurement variable at a connection point of the first energy accumulator and of the fitrther energy accumulator.

7. The measuring arrangement of claim 5, wherein:
the further measuring unit is configured to capture the polarity of the electrical measurement variable of the further energy accumulator;
the measuring device comprises a common measuring unit for capturing the polarity of the electrical measurement variable at the connection point of the first energy accumulator and of the further energy accumulator in order to obtain a common polarity; and
the processor device is configured to identify the malfunction of the energy accumulator arrangement by comparing the polarity of the electrical measurement variable of the first energy accumulator or the polarity of the further electrical measurement variable with the common polarity.

8. The measuring arrangement of claim 1, further comprising a circuit arrangement comprising:
a first controllable switch configured to electrically connect the first energy, accumulator to the measuring device; and
a further controllable switch configured to electrically connect the further energy accumulator to the measuring device in order to connect the first energy accumulator and the further energy accumulator in parallel;
wherein the processor device is configured to close the first switch and the further switch, or to keep the first switch and the further switch closed, to capture the polarity of the electrical measurement variable of the first energy accumulator and to capture the polarity of the further electrical measurement variable.

9. The measuring arrangement of claim 8, wherein:
the processor device is configured to keep the first switch closed and to open the further switch in order to disconnect the further electrical energy accumulator from the measuring device to capture the first electrical measurement variable of the first electrical energy accumulator and to keep the further switch closed and to open the first switch in order to disconnect the first energy accumulator from the measuring device to capture the further electrical measurement variable of the further electrical energy accumulator, and
the measuring device is configured to measure the first electrical measurement variable and the further electrical measurement variable in succession.

10. The measuring arrangement of claim 8, the processor device being configured to capture the first electrical measurement variable and the further electrical measurement variable if a malfunction of an energy accumulator in the energy accumulator arrangement is identified.

11. The measuring arrangement of claim 8, the processor device being configured to evaluate the measured electrical measurement variables in comparison with electrical reference variables in order to detect a malfunction of the first energy accumulator or of the further energy accumulator.

12. The measuring arrangement of claim 11, the processor device being configured to permanently open the first controllable switch if a malfunction of the first energy accumulator is detected in order to disconnect the first energy accumulator or to permanently open the further controllable switch if a malfunction of the further energy accumulator is detected in order to disconnect the further energy accumulator.

13. The measuring arrangement of claim 1, the measuring arrangement having a connection terminal configured to connect the circuit arrangement to an uninterruptible voltage supply, in order to provide the electrical energy accumulators for the auxiliary energy supply.

14. The measuring arrangement of claim 1, further comprising the first energy accumulator and the further energy accumulator.

15. An auxiliary energy supply apparatus for providing electrical energy in a manner independent of a mains, comprising:
   an energy accumulator arrangement comprising a first energy accumulator and at least one further energy accumulator, the first energy accumulator and the further energy accumulator being electrically connected in parallel;
   a measuring arrangement for identifying a malfunction of the energy accumulator arrangement, the measurement arrangement comprising:
   a measuring device configured to capture a polarity of an electrical measurement variable of the first energy accumulator and a polarity of a further electrical measurement variable in the energy accumulator arrangement;
   a processor device configured to identify the malfunction of the energy accumulator arrangement by comparing the polarity of the electrical measurement variable of the first energy accumulator and the polarity of the further electrical measurement variable; and
   a communication interface.

16. The auxiliary energy supply apparatus of claim 15, the processor device of the measuring arrangement being configured to identify the malfunction of the energy accumulator arrangement if the polarity of the electrical measurement variable of the first energy accumulator and the polarity of the further electrical measurement variable are different.

17. The auxiliary energy supply apparatus of claim 15, the measuring device of the measuring arrangement being configured to capture the polarity of the electrical measurement variable of the first energy accumulator and the polarity of the further electrical measurement variable by capturing an electrical direction of the electrical measurement variable of the first energy accumulator and of the further electrical measurement variable.

18. The auxiliary energy supply apparatus of claim 15, wherein the further electrical measurement variable comprises at least one of: an electrical measurement variable of the further energy accumulator, or an electrical measurement variable at a connection point of the first energy accumulator and of the further energy accumulator.

19. The auxiliary energy supply apparatus of claim 15, further comprising:
   a first measuring unit configured to capture the polarity of the electrical measurement variable of the first energy accumulator; and
   a further measuring unit configured to capture the polarity of the further electrical measurement variable.

20. The auxiliary energy supply apparatus of claim 19, wherein:
   the first measuring unit is configured to capture the polarity of the electrical measurement variable of the first energy accumulator;
   the further measuring unit is configured to capture the polarity of the electrical measurement variable of the further energy accumulator or the polarity of the further electrical measurement variable at a connection point of the first energy accumulator and of the further energy accumulator.

* * * * *